US010107023B2

(12) United States Patent
Fischer

(10) Patent No.: US 10,107,023 B2
(45) Date of Patent: *Oct. 23, 2018

(54) GATE HAVING AN INSULATING CURTAIN

(71) Applicant: SEUSTER KG, Lüdenscheid (DE)

(72) Inventor: Jörg Fischer, Lüdenscheid (DE)

(73) Assignee: SEUSTER KG, Luedenscheid (DE)

( * ) Notice: Subject to any disclaimer, the term of this patent is extended or adjusted under 35 U.S.C. 154(b) by 33 days.

This patent is subject to a terminal disclaimer.

(21) Appl. No.: 15/480,721

(22) Filed: Apr. 6, 2017

(65) Prior Publication Data

US 2017/0211307 A1 Jul. 27, 2017

Related U.S. Application Data

(63) Continuation of application No. 14/889,234, filed as application No. PCT/EP2014/001555 on Jun. 6, 2014, now Pat. No. 9,631,424.

(51) Int. Cl.

| | |
|---|---|
| ***E06B 9/40*** | (2006.01) |
| ***E05D 15/24*** | (2006.01) |
| ***E06B 9/13*** | (2006.01) |
| ***E06B 3/34*** | (2006.01) |
| ***E06B 3/48*** | (2006.01) |

(Continued)

(52) U.S. Cl.

CPC ........... *E05D 15/242* (2013.01); *E05D 15/24* (2013.01); *E05D 15/38* (2013.01); *E06B 3/34* (2013.01);

(Continued)

(58) Field of Classification Search

CPC ..... E06B 9/08; E06B 9/13; E06B 9/56; E06B 9/58; E06B 2009/135; E06B 2009/17069;

(Continued)

(56) References Cited

U.S. PATENT DOCUMENTS

| | | | |
|---|---|---|---|
| 4,156,448 | A | 5/1979 | Bengtsson |
| 4,397,347 | A | 8/1983 | Brabant |

(Continued)

FOREIGN PATENT DOCUMENTS

| | | | |
|---|---|---|---|
| DE | 2608728 | A1 | 9/1976 |
| DE | 3939231 | C1 | 11/1990 |

(Continued)

OTHER PUBLICATIONS

PCT Search Report dated May 1, 2015 for priority PCT application, PCT/EP2014/001555. (The original Search Report is in German.).

*Primary Examiner* — Katherine W Mitchell
*Assistant Examiner* — Jeremy C Ramsey
(74) *Attorney, Agent, or Firm* — Stinson Leonard Street LLP

(57) ABSTRACT

A door, in particular a roll-up door, having a curtain that can be moved between a closed position in which it is arranged, at least in sections, approximately in a plane and an open position in which it is wound, preferably at least in sections, on a winding shaft, said curtain having at least one thermally insulating region such as an insulating body, preferably made of PE form. The insulating region is formed by a pocket bordered at least partially by strip-shaped, deformable reinforcing layers, in particular made of plastics, particularly preferably made of PVC.

8 Claims, 10 Drawing Sheets

(51) Int. Cl.

| | |
|---|---|
| ***E06B 5/10*** | (2006.01) |
| ***E06B 9/58*** | (2006.01) |
| ***E05D 15/38*** | (2006.01) |
| ***E06B 3/38*** | (2006.01) |
| ***E06B 9/56*** | (2006.01) |
| *E06B 9/17* | (2006.01) |

(52) U.S. Cl.
CPC .................. *E06B 3/38* (2013.01); *E06B 3/48* (2013.01); *E06B 5/10* (2013.01); *E06B 9/13* (2013.01); *E06B 9/56* (2013.01); *E06B 9/58* (2013.01); *E06B 2009/135* (2013.01); *E06B 2009/17069* (2013.01); *H05K 999/99* (2013.01)

(58) Field of Classification Search
CPC ...... E06B 2009/1505; E06B 9/15; E06B 3/48; E06B 3/38; E05D 15/38; E05D 15/242
See application file for complete search history.

(56) References Cited

U.S. PATENT DOCUMENTS

| | | | | |
|---|---|---|---|---|
| 4,445,958 | A | 5/1984 | Jaksha | |
| 4,574,861 | A | 3/1986 | Mao | |
| 4,736,785 | A | 4/1988 | Seuster | |
| 5,291,931 | A * | 3/1994 | Kraeutler | E06B 9/063 160/84.01 |
| 5,353,858 | A | 10/1994 | Hartmann | |
| 5,915,445 | A * | 6/1999 | Rauenbusch | B32B 3/26 160/230 |
| 6,659,158 | B2 | 12/2003 | Laugenbach | |
| 7,918,263 | B2 | 4/2011 | Kraeutler | |
| 2010/0132894 | A1 | 6/2010 | Knutson et al. | |
| 2012/0018102 | A1 * | 1/2012 | Ungs | E06B 9/13 160/113 |
| 2012/0043031 | A1 | 2/2012 | Leighton | |
| 2012/0291966 | A1 | 11/2012 | Kraeutler | |
| 2013/0098567 | A1 | 4/2013 | Ashelin et al. | |
| 2013/0340953 | A1 * | 12/2013 | Knutson | E06B 3/80 160/236 |

FOREIGN PATENT DOCUMENTS

| | | | |
|---|---|---|---|
| DE | 10342301 | A1 | 4/2005 |
| DE | 102005013414 | A1 | 9/2006 |
| DE | 102007021942 | A1 | 11/2008 |
| EP | 0076349 | A1 | 4/1983 |
| FR | 2934003 | A1 | 1/2010 |
| GB | 2235586 | A | 3/1991 |

* cited by examiner

GATE HAVING AN INSULATING CURTAIN

CROSS-REFERENCE TO RELATED APPLICATIONS

This application claims priority to and is a Continuation of U.S. patent application Ser. No. 14/889,234, filed on Nov. 5, 2015, which clams priority to international application PCT/EP2014/001555 filed on Jun. 21, 2014, which claims priority to German Utility Model No. 202013005164 which was filed on Jun. 6, 2013, each of which is incorporated herein by reference in its entirety.

STATEMENT REGARDING FEDERALLY SPONSORED RESEARCH OR DEVELOPMEN

Not applicable.

BACKGROUND OF THE INVENTION

1. Field of the Invention

This invention relates generally to insulated rolling gates.

2. Description of Related Art

Such gates are, for instance, used as so-called high-speed gates in the area of refrigeration and deep-freezing chambers but also in the area of heating chambers, for example in the vulcanization of car tires. In addition, it is conceivable to use corresponding gates in normal outdoor applications with high-speed gates in the future, too. Within the framework of the increasing requirements of the Thermal Insulation Ordinance, the heat transfer of a commercially available high-speed gate with flexible curtain (curtain thickness between 0.6 mm and 1.5 mm) can be multiply improved by using an insulating curtain. For this purpose, the molded bodies may be manufactured of polyethylene foam. To obtain the desired windability, the insulating bodies are conventionally designed in the form of lamellae, the height of which in the curtain movement direction is 35 cm or less. The individual lamellar insulating bodies are interconnected via stabilizing connection arrangements. For this purpose, the insulating bodies are slit along their edges that run perpendicular to the path of movement of the curtain and are provided with a welt having a flap enclosed in the slot. Hence, the transmission of force between successive insulating body lamellae takes place via the welts and the stabilizing connection arrangement, the force being fed directly into the insulating foam.

For preserving the desired stability while avoiding the formation of heat or cold bridges, the connection arrangements may be embodied in two parts, one part being formed of a thermally insulating material, such as a plastic section, while the other part, which is used for linking the welts, may be manufactured of a metallic material, such as an aluminum section. The edges of the insulating lamellae that face each other are enclosed between the terminal areas of the individual parts of the connection arrangement.

Using gates of the type described above, it is possible to achieve the insulating effect required for refrigeration and deep-freezing chambers. It has, however, been shown that, particularly in the area of the connections between the individual lamellae, such gates are susceptible to wear and damage.

BRIEF SUMMARY OF THE INVENTION

In view of these problems in the prior art, the invention is based on the objective of providing gates suitable for use in refrigeration and deep-freezing chambers, in which the risk of damages is reduced.

According to the invention, this objective is achieved by an enhancement of the prior art gates, which is essentially characterized in that at least one insulating area is formed by a pocket that is at least partially delimited by web like deformable reinforcing layers of polyvinyl chloride ("PVC"), for instance, in which preferably at least one insulating body is enclosed.

Additional aspects of the invention, together with the advantages and novel features appurtenant thereto, will be set forth in part in the description which follows, and in part will become apparent to those skilled in the art upon examination of the following, or may be learned from the practice of the invention. The objects and advantages of the invention may be realized and attained by means of the instrumentalities and combinations particularly pointed out in the appended claims.

LIST OF REFERENCE NUMBERS

Figure 1:
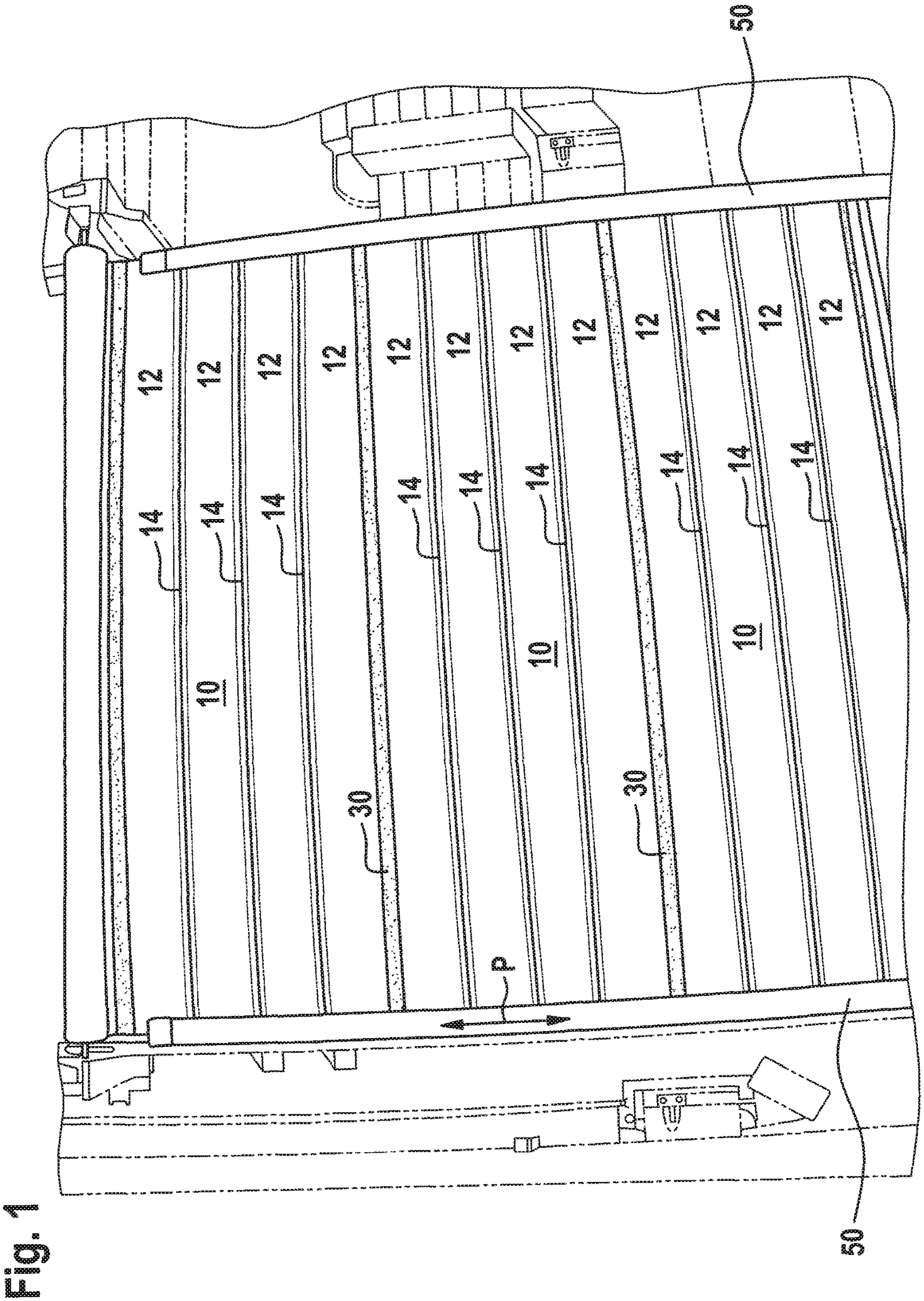
FIG. 1 a gate according to the invention having a curtain in closed position, FIG. 2 a gate according to the invention having a semi-open curtain, FIG. 3 a curtain wound onto a winding shaft of a gate according to the invention, FIG. 4 a detail view of the connection arrangement between successive sections of a curtain according to the invention, FIG. 5 a detail view of a transition between successive insulating bodies of a section of a curtain according to one embodiment of the invention, FIG. 6 a detail view of the connection of the sections on the aluminum section of FIG. 4, FIG. 7 a section of a curtain according to a second embodiment of the invention.

10 Sections
12, 122 Insulating Bodies
14, 116 Connection Line(s)
20, 120 Reinforcing web(s)/Reinforcing layer(s)
30 Stabilization Arrangement(s)/Connection Arrangement(s)
32 Plastic Section
34 Aluminum Section
40 Welt
50 Guide Rails
60 Winding Shaft
70 Material Web
75 Chamber(s)
77 Additional Curtain Component
114 Connecting Webs
122 Welt-like Bulge
200 Plastic Section
212 Groove Openings
300 Coupling Links
310 Carrying Strap
315 Guide Rail
350 Coupling Device
P Direction of Movement

DETAILED DESCRIPTION OF INVENTION

The invention herein is based on the findings that the problems observed in prior art can be solved if a separation of functions is implemented, in which the desired mechanical properties are assured by a reinforcing web and the desired thermal properties by the insulating areas or insulating bodies, the insulating effect being assured in that, while simultaneously maintaining the desired mechanical properties, the reinforcing web is manufactured of a thermally insulating plastic, which does not form any heat or cold bridges and has the durability required for obtaining the desired mechanical properties.

Just as with the conventional insulating curtains, for assuring the windability, a curtain according to the invention may also have two, three or a plurality of insulating areas or insulating bodies arranged in series in the direction of movement. In this arrangement, the desired durability can be obtained without any interference with the insulating properties and the windability, if at least two insulating bodies are enclosed in pockets formed between the reinforcing layers and separated from each other by at least one connecting line running approximately perpendicular to the direction of movement between the connecting layers. Hence, in other words, between two reinforcing webs two, three or a plurality of pockets are formed, which are separated from each other by connecting lines between the reinforcing webs. These connecting lines may, for instance, be obtained by welding the reinforcing webs along the connecting lines.

In the area of the connecting lines, the insulating effect of the curtain is reduced because narrow elements without the insulating bodies that are enclosed in the pockets exist there. The insulating properties of a curtain according to the invention can be further enhanced if at least one additional chamber is provided, extending along a connecting line and preferably embodied by a material web, in particular of PVC, that is attached to a boundary area of a reinforcing web facing away from the insulating body, for receiving an additional curtain component, in particular in the form of an additional insulating body, arranged between the insulating bodies enclosed in the pockets. As a result of this additional curtain component, the interstice formed between the insulating bodies in the area of the connecting lines is filled up and the insulating effect is improved.

In another embodiment of the invention, the reinforcing layers are interconnected via a connection assembly that separates successive pockets from each other. In a structurally particularly simple embodiment of the invention, the connection assembly has a connecting web 114 attached to the inner boundary areas that face each other of the reinforcing layers. The reinforcing layer may, for instance, be welded to the boundary areas that are situated opposite each other of the reinforcing layer. By using the connecting web 114, the reduction of the distance between the boundary areas that face each other of the reinforcing web, which would otherwise take place, is avoided. Hence, the formation of an additional pocket along the connecting line can be avoided.

Additionally or alternatively, the connection assembly may have at least one plastic section extending perpendicular to the direction of movement of the curtain and preferably attached in a form-fitting manner to the inner boundary areas of the reinforcing layers. In this embodiment, the reinforcing layers may extend over the entire curtain height. A composition of the curtain of individual sections, which are interconnected via connection arrangements, is not necessary in this arrangement.

For connecting the reinforcing layers to the plastic section, at least one reinforcing layer may have, at its inner boundary area, one welt-like covering extending approximately perpendicular to the direction of movement of the curtain and enclosed in a groove of the plastic section.

As a result, between the plastic section and the reinforcing layers, a chamber is formed, in which an insulating body may be enclosed.

If the chamber remains unfilled, in the unwound state air can be used as an insulator. During the opening operation or when winding the curtain on the winding shaft, the plastic sections tilt and can be wound onto the shaft via the flat side.

If the curtain is formed of individual sections arranged in series in the direction of movement and interconnected by means of connection arrangements, in case of damage, individual sections can be exchanged independent of other sections. Hence, the possibility exists of exchanging only the damaged section, which can be easily and quickly accomplished by suitable connections between the individual sections, such as a connection using a welt technique described below.

In accordance with a further enhancement of the mechanical properties of gates according to the invention, it has proven to be expedient if the curtain has two, three or a plurality of sections, of which at least two have at least one insulating body enclosed in a pocket and are interconnected, via a stabilizing connection arrangement, along edges that run approximately perpendicular to the direction of movement the curtain. Such a stabilization arrangement provides the curtain stability with respect to forces acting perpendicular to the main surface of the curtain, by combining a number of insulating bodies in a section, this mechanical enhancement being obtainable without any substantial impairment of the insulating properties. In the two embodiments of the invention explained above, the thicknesses of the pockets is variable, running in the closed position extending in a thickness direction perpendicular to the gate leaf plane. An insulating foam of variable thickness may be used. Customarily, the thickness will be approximately 20 mm.

Depending on the requirements, it can be adapted to the heat transfer value. During operation of corresponding gates, the change in the reel diameter per revolution, related to a change in the curtain thickness, can be compensated using a suitable roller mechanism in the area of the winding shaft. Using a corresponding roller mechanism, it is possible to assure in a manner known per se that, per winding, the shaft moves by the changing winding diameter, in order to keep in this manner the guide arrangement used for guiding the closing and opening movements constant or almost constant in the infeed position of the curtain.

Expediently, the individual sections have, adjacent to the connection arrangement and running approximately perpendicular to the direction of movement of the curtain, edges, along which the reinforcing webs of the sections, are interconnected, in particular welded, forming a welt and across which welts are linked to the connection arrangement. Hence, the mechanical connection of the individual curtain components can take place without any mechanical load on the insulating bodies.

In order to assure the desired insulating properties, it has proven to be expedient for the connection arrangement to consist at least partly of thermally insulating material, such as plastic. The desired mechanical properties can be obtained if the connection arrangement has at least one coupling element, preferably embodied in the form of a metal section, in particular an aluminum section, for linking the welt. Both the plastic section and the aluminum section of the connection arrangement according to the invention extends approximately perpendicular to the direction of movement of the curtain. Between plastic section and aluminum section, receptacles facing the welts may be arranged.

For the purpose of stabilizing the curtain against wind loads and for providing improved sealing, it has proven to be expedient if on at least one lateral edge of the curtain extending in the direction of movement, a coupling device is attached, which, when the closed position is reached, cooperating with a permanently attached coupling device, counteracts deformation of the curtain subject to wind loads. The coupling device attached to the curtain coupling device may, for instance, be embodied in the form of a zipper strip having a carrying strap and coupling links arranged thereon. During a closing movement, the coupling links may drive into a slit plastic element, which is arranged in the area of a lateral guide rail for the curtain. In this manner, a form-fit attachment of the lateral edge to the guide rail is achieved. For feeding the coupling links into the plastic receptacle, a funnel-like infeed device can be arranged at the upper end of the guide rail, by means of which the coupling links are threaded into the plastic receptacle, as soon as the curtain is unwound from the winding shaft.

A curtain suitable for the manufacture of gates according to the invention is essentially characterized in that it has at least one insulating body enclosed in a pocket formed between web like reinforcement layers. In all the embodiments of the invention, the curtain may have a stabilizing element, in the closed position arranged at the lower edge of the curtain and elastically deformable. In this arrangement, the stabilizing element may be embodied in such a way that the resetting force that counteracts deformation of the stabilizing element in a direction opposing the closing direction is smaller than the resetting force counteracting deformation of the stabilizing element in a direction running transverse thereto, in particular approximately perpendicular to the closing element in the closing position. The stabilizing element may have least one leaf spring embedded in an elastomer material having a main surface oriented perpendicular to the closing direction. Another advantageous embodiment of corresponding stabilizing elements is described in EP 1604091. The disclosure content of this document is hereby incorporated in the specification herein by express reference.

Figure 3:
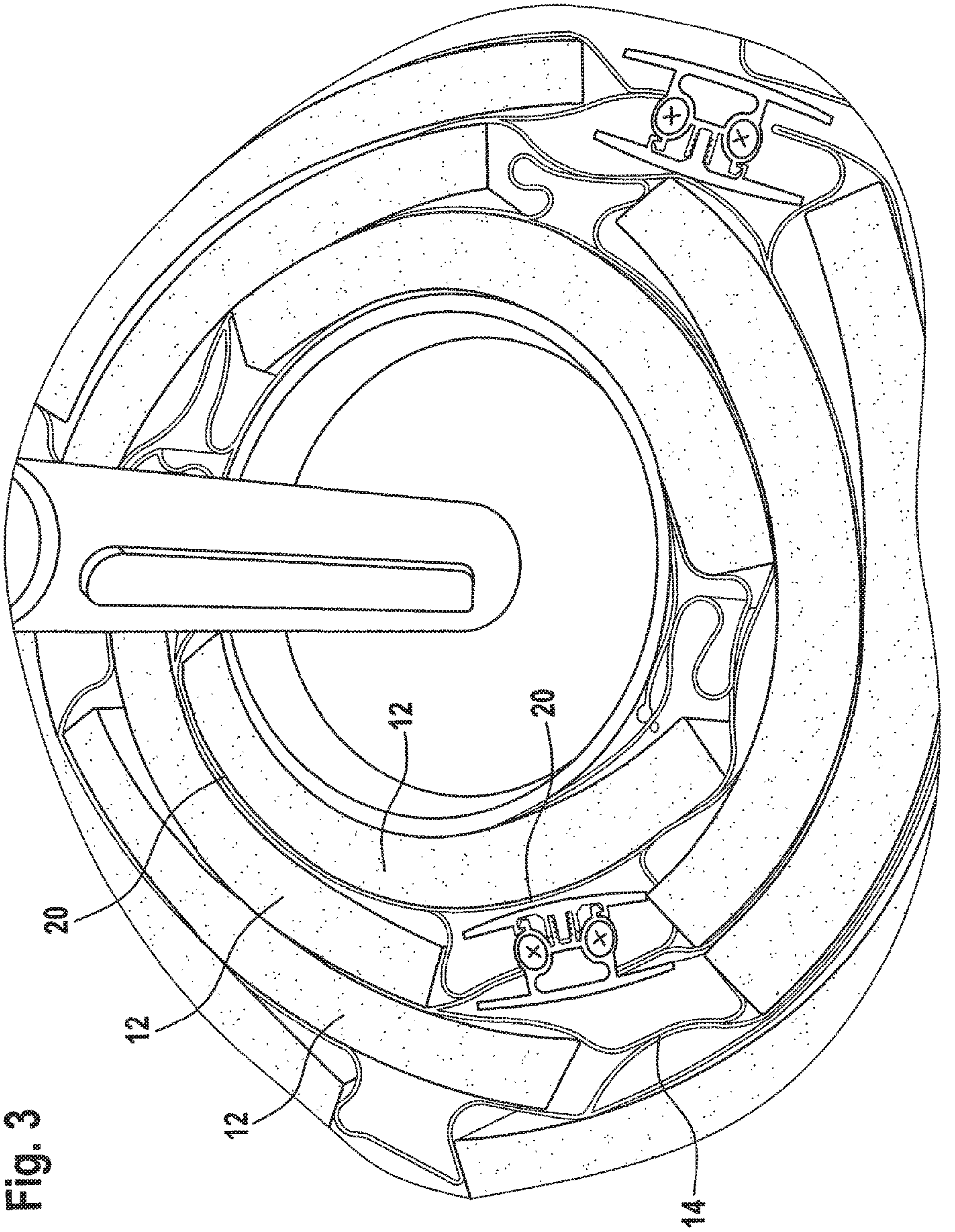
Figure 4:
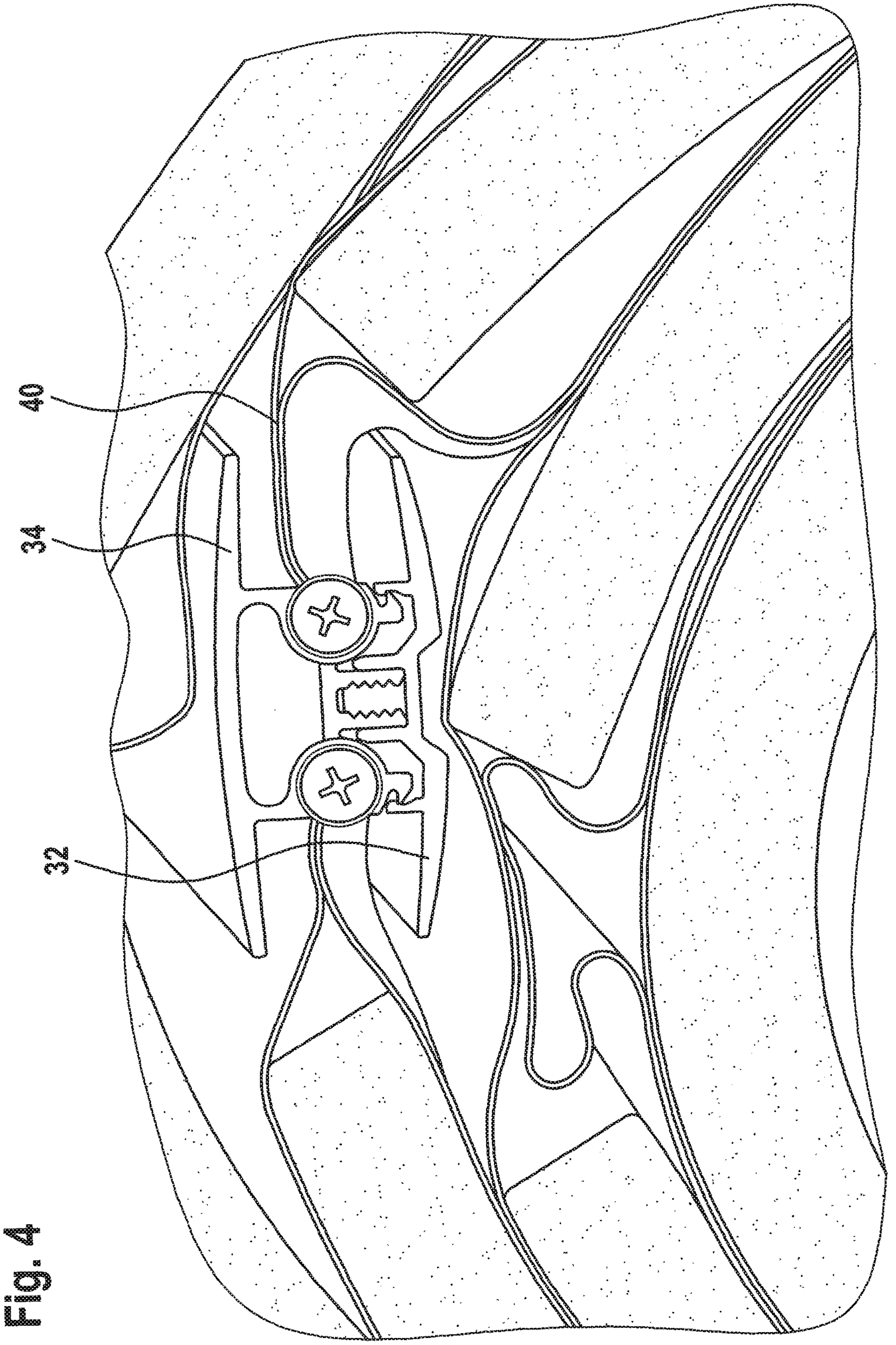
Figure 5:
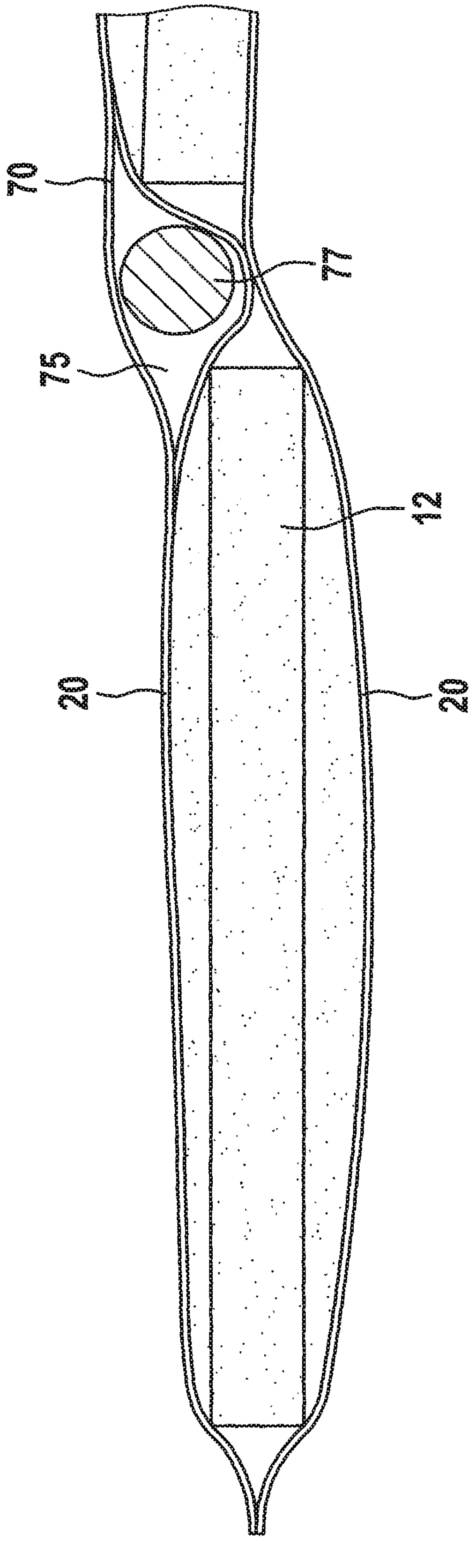

The curtain illustrated in FIG. 1 of a gate according to the invention comprises a total of three sections 10, which are interconnected via stabilizing assemblies 30. Each of the sections 10 has four insulating bodies 12, which are enclosed between reinforcing webs 20 (ref. FIGS. 3 to 5). As indicated by dual arrow P in FIG. 1, the curtain is movable in its entirety along guide rails 50 between a closed position, in which it is arranged in a plane extending between the guiderails 50 (hereinafter referred to as the "direction of movement"), and an open position, in which it is wound on a winding shaft 60. The lamellar insulating bodies 12 extend in a direction running approximately perpendicular to the direction of movement P. The stabilizing arrangements 30 also extend in a direction running approximately perpendicular to the direction of movement P. Between the individual insulating bodies 12 of the sections 10, the reinforcing webs 20 that form the pockets and in the embodiment of the invention shown in the drawing made of PVC, are welded to each other along lines running perpendicular to the direction of movement P. As a result, for every insulating body 12, a pocket enclosing it is formed between the reinforcing webs 20. The connecting lines are provided with the reference number 14 in FIG. 1.

Figure 2:
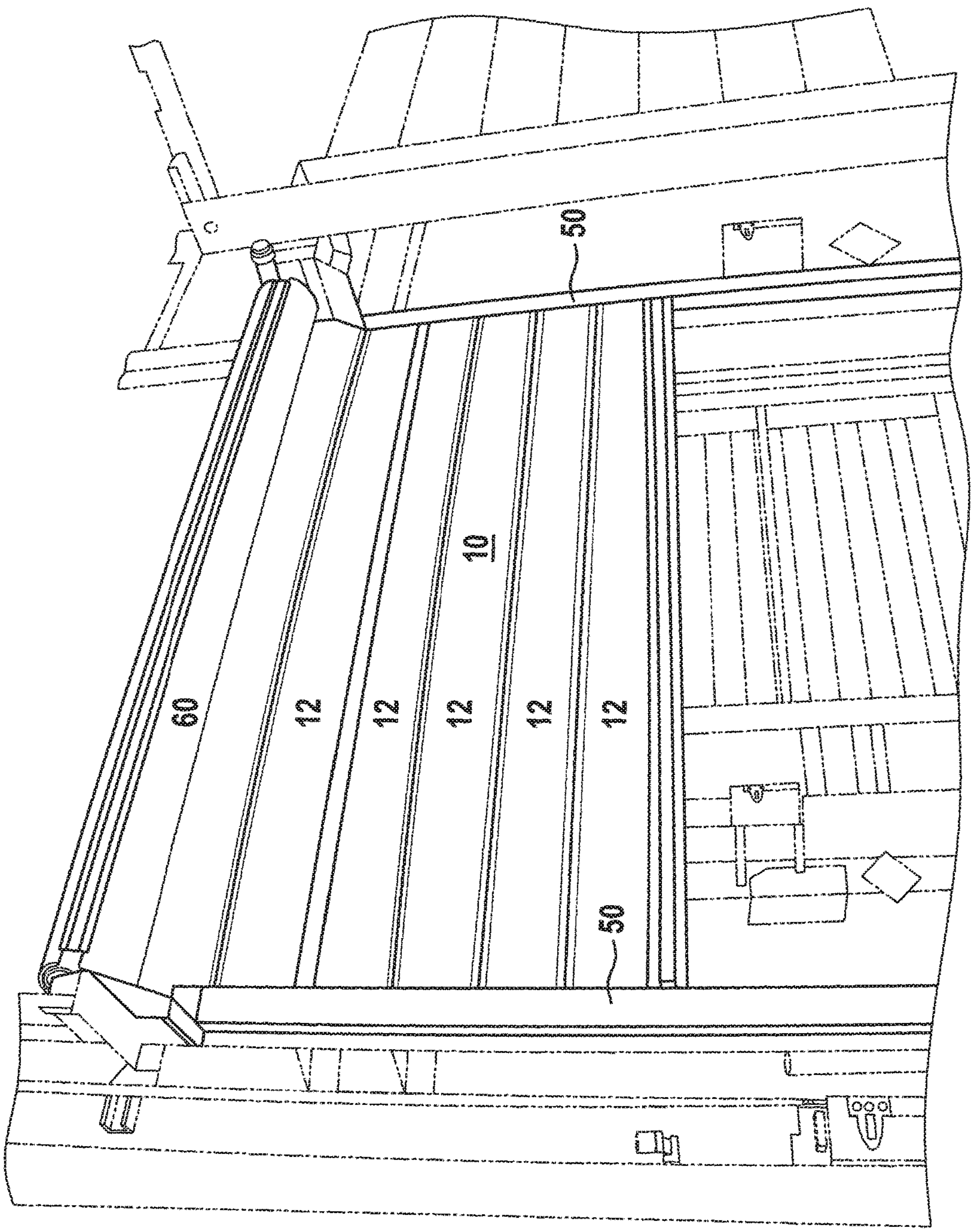

In FIG. 2, the curtain of the gate is partially wound on a winding shaft 60.

The curtain, completely wound on winding shaft 60, is recognizable in FIG. 3. According to FIG. 3, the insulating bodies 12 are enclosed between reinforcing webs 20, which are welded to each other along the connecting lines 14.

In FIG. 4, the connection arrangement 30, provided for connecting the individual sections 10, is represented in detail. The connection arrangement 30 comprises a plastic section 32 extending perpendicular to the direction of movement P and connected to an aluminum section 34, likewise extending approximately perpendicular to the direction of movement P. By using plastic section 32, thermal insulation is assured in the area of connection arrangement 30, too. The edges of the reinforcing webs 20 of the individual sections 10, facing connection arrangement 30, are welded to each other forming a welt 40 and are linked to the aluminum section 34. In this arrangement, a movement of the curtain can take place without any direct introduction of force into the insulating bodies 12. Instead, the transmission of force takes place by way of the durable yet thermally insulating reinforcing webs 20.

As particularly obvious in FIG. 4, the reinforcing web 20, which is situated inside on the reel, pushes the excess reinforcement material between the foam, in order to obtain a tight reel.

FIG. 5 presents the transition between successive pockets, each containing an insulating body 12, of a section 10. On both sides of the connecting line 14, by which the chambers 75 are separated from each other, on a boundary area of a reinforcing web 20, a material web 70 is attached, also formed of PVC. Between material web 70 and connecting line 14, a chamber 75 is formed, in which an additional component 77 of the curtain may be enclosed. This other component 77 may also be an insulating body 12. In this manner, the thermal insulation can also be obtained in the area of the transition between successive pockets.

Figure 6:
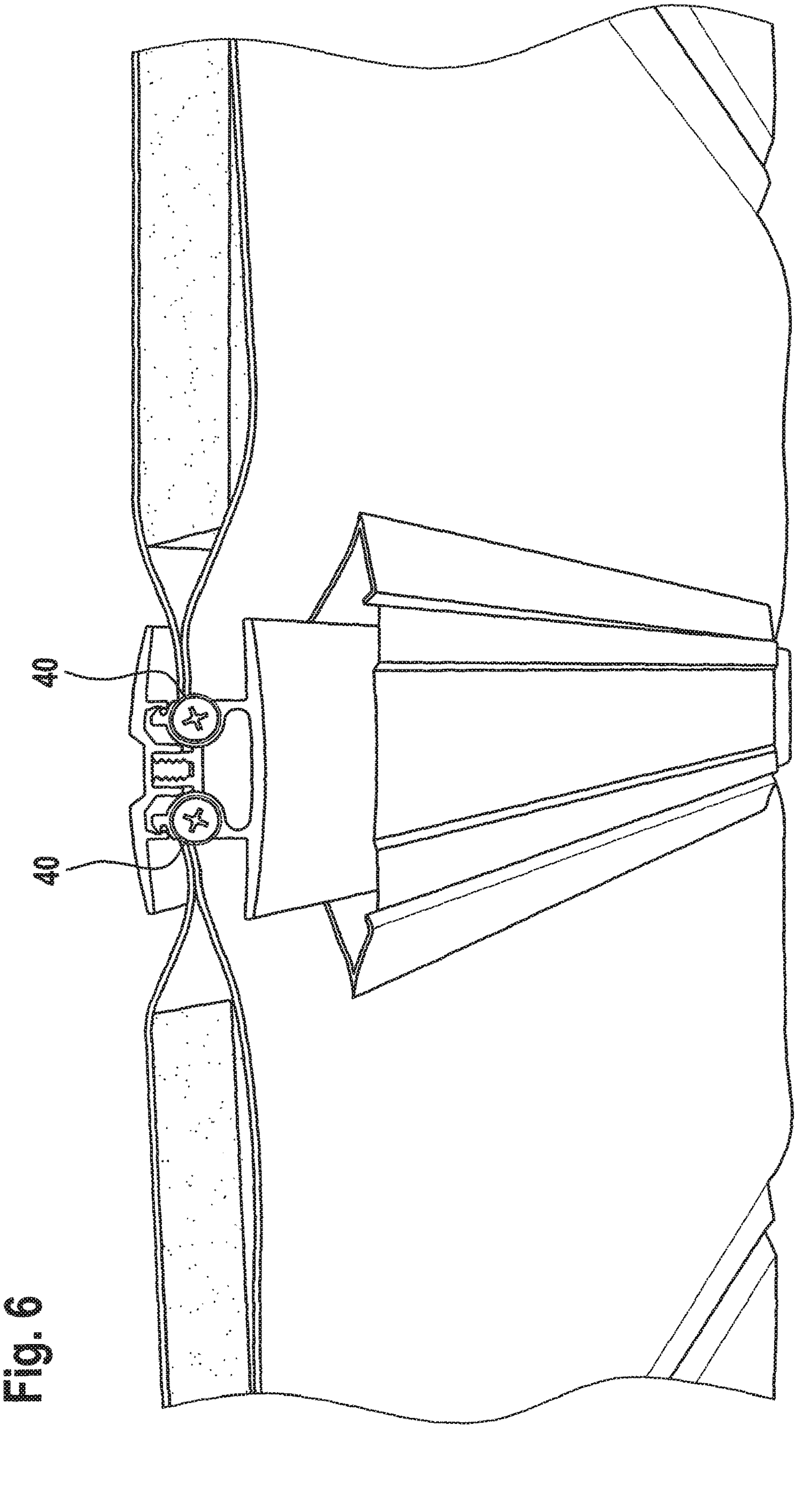

In accordance with FIG. 6, welt 40, provided on the edges of the sections 10, is enclosed in a form-fitting manner in corresponding recesses of aluminum section 34. Lateral slippage of section 10 with respect to aluminum section 34 can be prevented by a screw fastening at the end of aluminum section 34, as indicated in FIG. 4.

Figure 7:
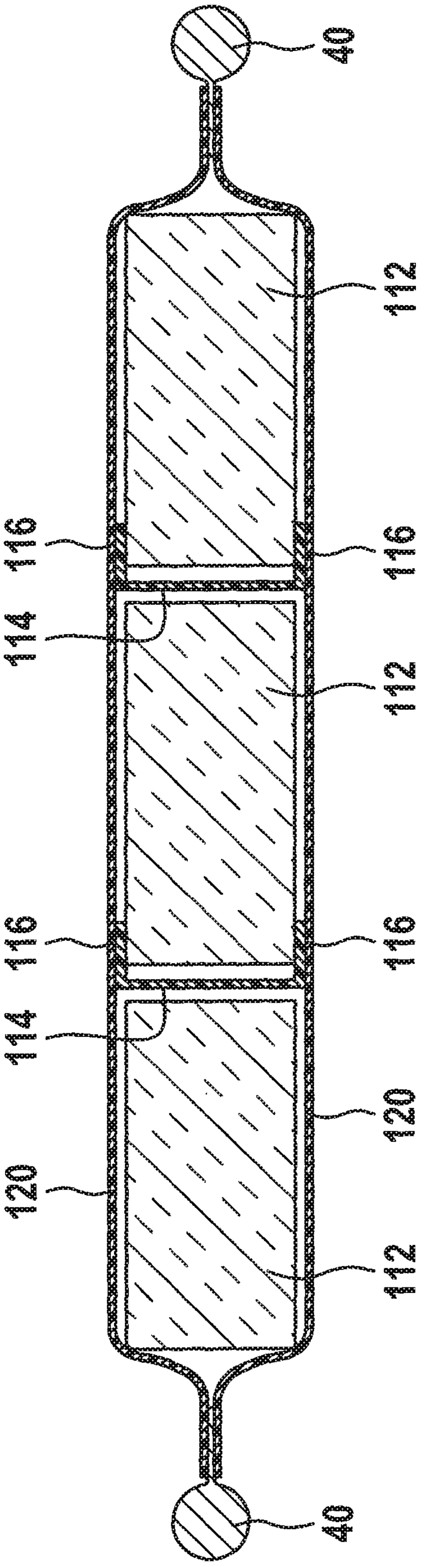

In the section 10 of a curtain according to a second embodiment of the invention, represented in FIG. 7, for forming the pockets receiving the insulating bodies 112, connection webs 114 are provided, which extend between the boundary areas that face each other of the reinforcing webs 120 and are welded to these boundary areas along corresponding connecting lines 116. The pocket formation can, therefore, take place without reducing the distance between the reinforcing webs 120. Hence, the insulating effect is not affected by the pocket formation. By their edges that run perpendicular to the direction of movement P, the reinforcing webs 120 are welded to each other subject to formation of welt 40.

Figure 8B:
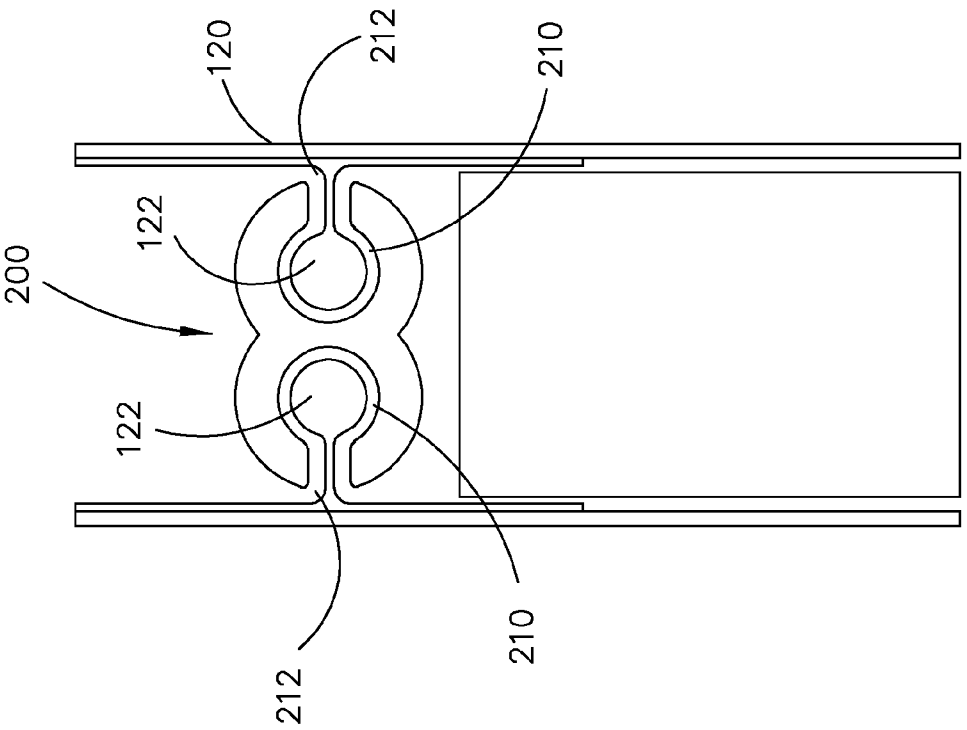
FIGS. 8A and 8B are schematic views of a curtain according to a third embodiment of the invention.
Figure 8A:
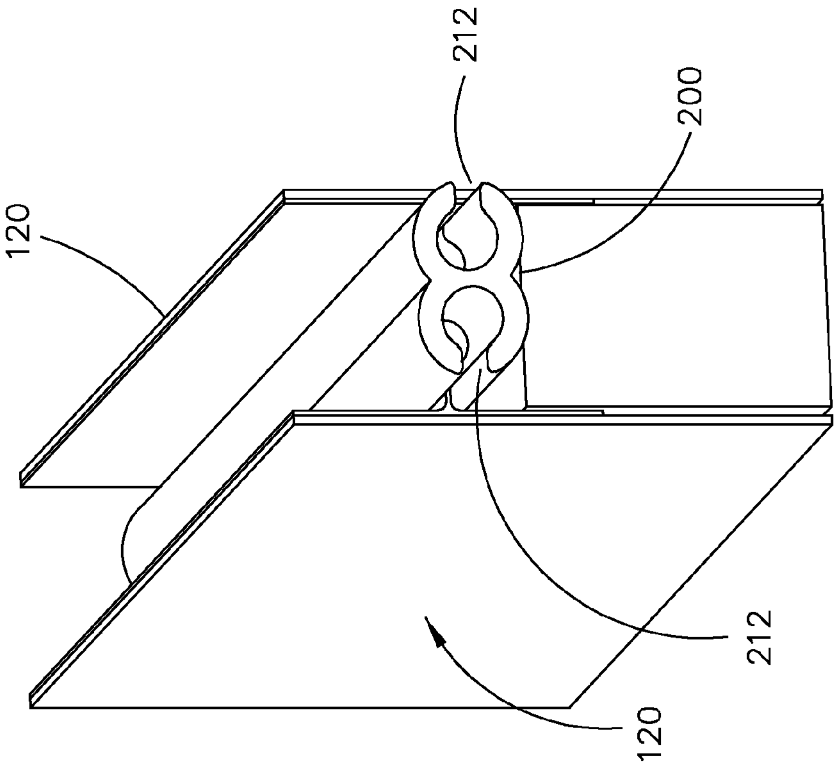

In the embodiment of the invention, schematically represented in FIGS. 8A and 8B, instead of connecting webs, plastic sections 200 are provided for delimiting the pockets. The plastic sections 200 are attached in a form-fitting manner to fastening elements on the boundary areas of the reinforcing layers that face each other. In the embodiment of the invention represented in FIGS. 8A and 8B, these fastening elements are embodied in the form of a welt-like bulge 122 extending perpendicular to the direction of movement of the gate leaf. Plastic section 200 is embodied approximately in the form of a horizontal figure eight, grooves used for receiving the welt-like bulge 122 being provided, their groove openings 212 having such small widths that the welt-like bulge 122 can no longer be removed from groove 210 in a direction running perpendicular to reinforcing layer 120. The welt-like bulges 122 can be pushed into the grooves 210 in an axial direction, the groove openings 212 allowing the passage of a welt flap connecting bulge 122 to the reinforcing layers 120. By means of the plastic sections 200, a minimum distance between the reinforcing layers in the closed condition of the curtain is assured. For providing the insulating effect, the insulating bodies 112 can be fed into the pockets thus delimited by the plastic sections 200. Additionally or alternatively, individual pockets may be filled with air only. If the pocket is filled with air only, the plastic sections 200 can tilt during the curtain winding operation and be wound onto the winding side via the flat side.

Figure 9A:
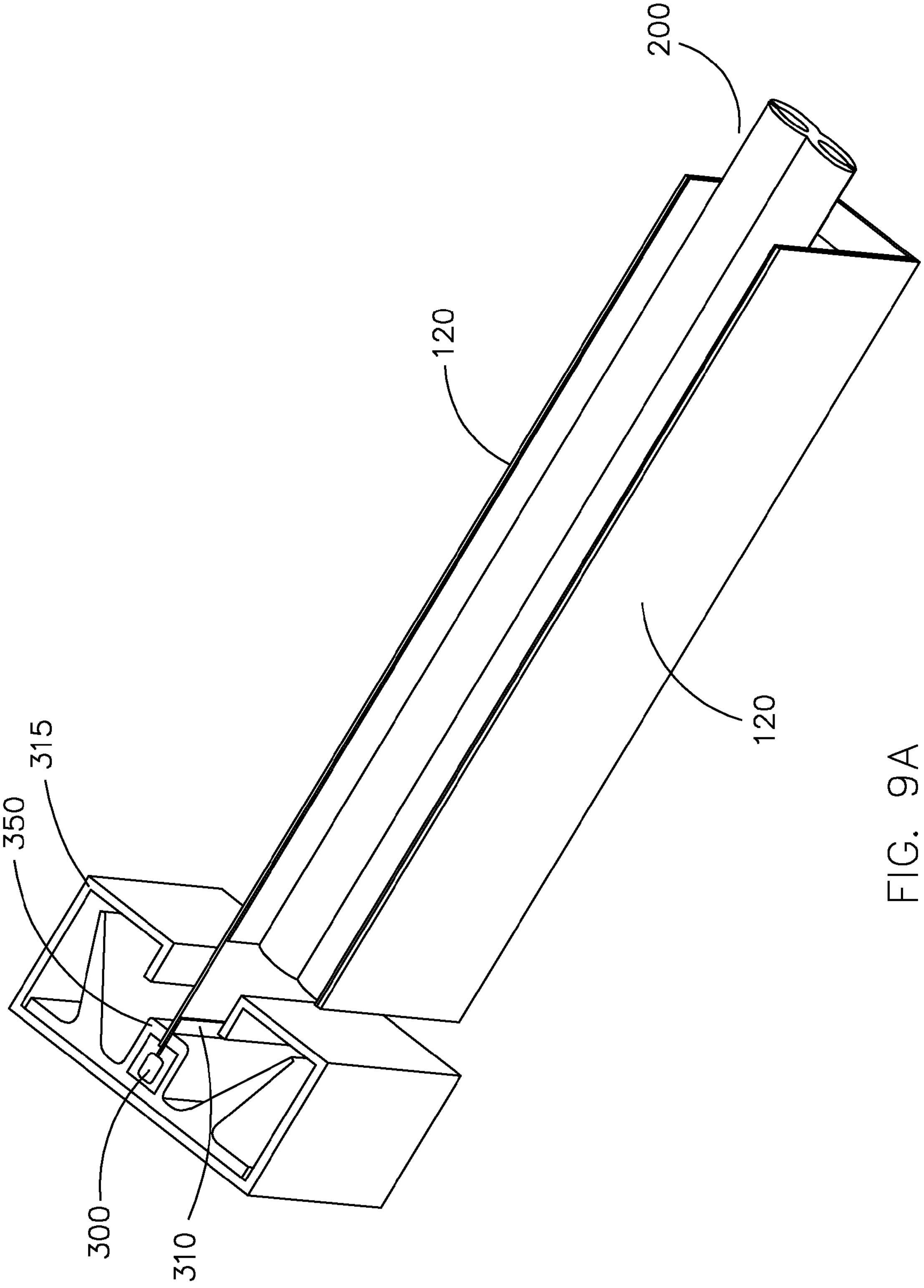
FIGS. 9A, 9B and 9C are schematic views of a coupling device of a gate according to the invention.
Figure 9B:
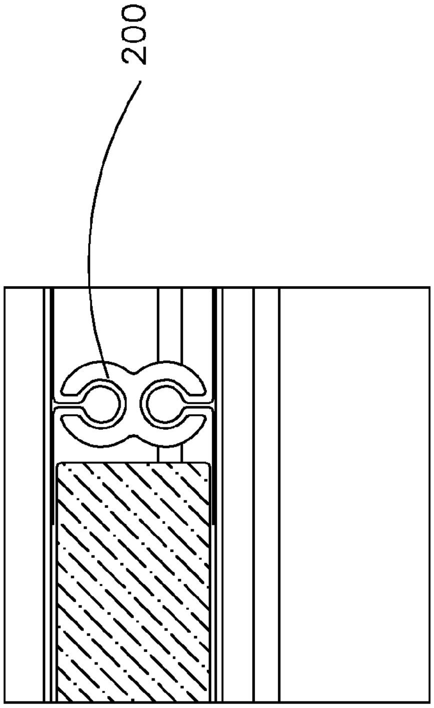
Figure 9C:
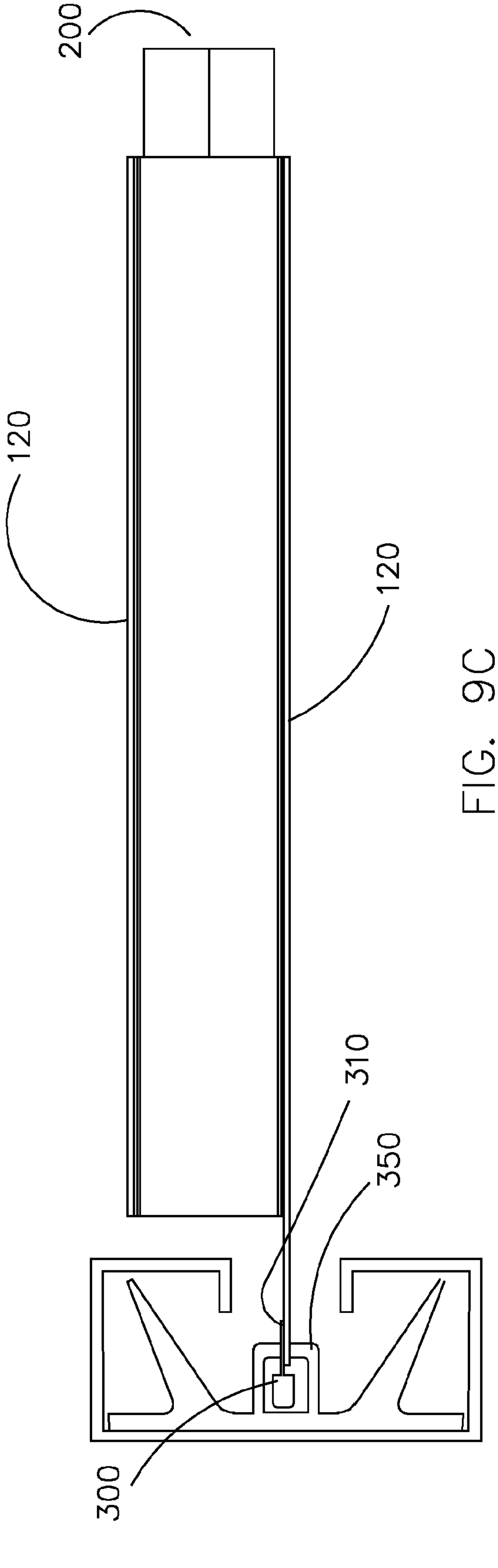

In the embodiment according to FIGS. 9A, 9B and 9C, on a lateral edge of reinforcing layer 120, running parallel to the direction of movement, a carrying strap 310 of a zipper is arranged, on the side of which facing away from reinforcing layer 120, coupling links 300 are arranged. In the closed state of the gate, the coupling links 300 are enclosed in a plastic guide 350, which is arranged within the lateral guide rail for the curtain. When unwinding the curtain from the winding shaft, via a funnel-like infeed, the coupling links 300 are fed into the guide rail 315.

The invention shall not be limited to the embodiment explained based on the drawing. Instead, the use of curtains with less than two and more than three sections is also conceivable. The insulating body may also be manufactured of other thermally insulating materials. The individual sections may have less than four and more than four insulating bodies. The connection between the material webs may instead be implemented by clamping elements or similar. It is also contemplated not to wind the curtain in the open position on a winding shaft.

From the foregoing it will be seen that this invention is one well adapted to attain all ends and objectives hereinabove set forth, together with the other advantages which are obvious and which are inherent to the invention.

Since many possible embodiments may be made of the invention without departing from the scope thereof, it is to be understood that all matters herein set forth or shown in the accompanying drawings are to be interpreted as illustrative, and not in a limiting sense.

While specific embodiments have been shown and discussed, various modifications may of course be made, and the invention is not limited to the specific forms or arrangement of parts and steps described herein, except insofar as such limitations are included in the following claims. Further, it will be understood that certain features and subcombinations are of utility and may be employed without reference to other features and subcombinations. This is contemplated by and is within the scope of the claims.

The invention claimed is:

1. A rolling gate, having a curtain comprising sections where the curtain is movable between a closed position, in which the sections are arranged approximately in one plane, and an open position, in which the sections are wound on a winding shaft, and wherein each section has two or more insulating pockets arranged in series along the one plane, each insulating pocket formed in part between two layers of a deformable plastic reinforcing web, each reinforcing web extending along the one plane and having an inside surface, adjacent the insulating body, and an opposite outside surface, and the at least two insulating pockets are separated from each other along a respective connecting line where the layers of reinforcing web are connected to each other, the respective connecting line running approximately perpendicular to a direction of movement (P) of the curtain and between adjacent pockets, and wherein each section has at least one thermally insulating body, the insulating body is enclosed in an insulating pocket of the two or more insulating pockets, and wherein a material web is attached to the outside surface of adjacent reinforcing webs and spans the respective connecting line, and between the respective connecting line and the material web is a chamber within which is an additional insulating body that extends approximately perpendicular to the direction of movement (P) of the curtain.

2. The rolling gate of claim 1, characterized in that two sections are interconnected along respective edges of the reinforcing webs running approximately perpendicular to the direction of movement of the curtain via a stabilizing connection arrangement.

3. The rolling gate according to claim 2, characterized in that the respective edges of the reinforcing webs adjacent to the connection arrangement are welded together forming a welt, and are linked to the connection arrangement via the welt.

4. The rolling gate according to claim 2, characterized in that the connection arrangement is at least partially comprised of a thermally insulating material.

5. The rolling gate according to claim 3, characterized in that the connection arrangement has at least one metal coupling element section for linking the welt.

6. The rolling gate according to claim 2, further comprising an elastically deformable stabilizing element arranged at a lower edge of the curtain when the curtain is in the closed position, a resetting force counteracting deformation of the stabilizing element in a direction counteracting a closing direction is smaller than a resetting force counteracting deformation of the stabilizing element in a direction running approximately perpendicular to the stabilizing element when the curtain is in the closed position.

7. The rolling gate according to claim 2, characterized in that a coupling device is attached on at least one lateral edge of the curtain, extending in the direction of movement of the curtain, said coupling device cooperating with a permanently installed coupling device, when the curtain is in the closed position to counteract deformation of the curtain subject to a wind load.

8. The rolling gate according to claim 1, wherein the insulating body is polyethylene (PE) foam, the reinforcing webs are polyvinyl chloride (PVC) and the material web is PVC.

* * * * *